United States Patent
Muyshondt et al.

(10) Patent No.: US 6,316,991 B1
(45) Date of Patent: Nov. 13, 2001

(54) OUT-OF-CALIBRATION CIRCUITS AND METHODS AND SYSTEMS USING THE SAME

(75) Inventors: Gabriel Patrick Muyshondt; Zheng Luo, both of Austin, TX (US)

(73) Assignee: Cirrus Logic, Inc.

( * ) Notice: Subject to any disclaimer, the term of this patent is extended or adjusted under 35 U.S.C. 154(b) by 0 days.

(21) Appl. No.: 09/537,605

(22) Filed: Mar. 29, 2000

(51) Int. Cl.[7] .................................. G05F 1/10; G05F 3/02
(52) U.S. Cl. .............................. 327/543; 327/74; 327/77; 327/407; 327/540
(58) Field of Search .................................. 327/538, 540, 327/541, 543, 334, 407, 468, 74, 77

(56) References Cited

U.S. PATENT DOCUMENTS

| | | | |
|---|---|---|---|
| 5,388,084 | * | 2/1995 | Itoh et al. ............................. 327/538 |
| 5,426,616 | * | 6/1995 | Kajigaya et al. ..................... 327/543 |
| 5,870,401 | * | 2/1999 | Riley ..................................... 327/540 |
| 6,075,390 | * | 6/2000 | Shin et al. ............................ 327/403 |
| 6,211,712 | * | 4/2001 | Baik ....................................... 327/74 |

* cited by examiner

*Primary Examiner*—Terry D. Cunningham
*Assistant Examiner*—Long Nguyen
(74) *Attorney, Agent, or Firm*—James J. Murphy, Esq.; Winstead Sechrest & Minick

(57) ABSTRACT

A voltage out-of-calibration detector 200 includes a voltage divider operating between first and second voltage rails and having a plurality of taps 203 for generating first and second comparison voltages. A first set of switches 205 selectively couples at least one of the plurality of taps 203 to the input of a first voltage comparator 401*a*, first voltage comparator 401*a* comparing the first comparison voltage with an input voltage and outputing a signal when the input voltage exceeds the first comparison voltage. A second set of switches 206 selectively couples at least one of the plurality of taps 203 to an input of a second voltage comparator 401*b*, second voltage comparator 401*b* comparing the second comparison voltage with the input voltage and outputing a signal when the input voltage is below the second comparison voltage. Control logic 300 selectively activates the first and second sets of switches 205/206 in response to received control signals.

17 Claims, 3 Drawing Sheets

OUT-OF-CALIBRATION CIRCUITS AND METHODS AND SYSTEMS USING THE SAME

BACKGROUND OF THE INVENTION

1. Field of the Invention

The present invention relates in general to electronic circuits and in particular to circuitry for out-of-calibration circuits and methods and systems using the same.

2. Description of the Related Art

In many voltage controlled circuits, precise voltage calibration of the control signals is critical to optimizing performance. For example, in the case of a phase-locked loop (PLL), the voltage controlled oscillator tuning voltage must be set within calibration limits to insure that the proper PLL output frequency is maintained. The calibrated voltage must then be maintained within those limits throughout circuit operation, notwithstanding the tendency of the signal to drift from the calibrated voltage due to temperature rise and/or fluctuations in the supply voltage.

In order to adjust or compensate for voltage changes in a given signal, some technique is required for monitoring that signal and detecting instances when the signal voltage drifts outside the selected calibration tolerance range. Optimally, this technique should be flexible such that it may be used in various applications calling for different nominal calibration voltages and tolerance ranges. Moreover, such a technique should allow for the calibration tolerances to be easily changed, even on the fly, as allowed by the given operating conditions of the device.

SUMMARY OF THE INVENTION

According to the principles of the present invention, a voltage out-of-calibration detector is disclosed which includes a voltage divider operating between first and second voltage rails and having a plurality of taps for generating first and second comparison voltages. A first set of switches selectively couples at least one of the plurality of taps to the input of a first voltage comparator, the first voltage comparator comparing the first comparison voltage with an input voltage and outputing a signal when the input voltage exceeds the first comparison voltage. A second set of switches selectively couples at least one of the plurality of taps to an input of a second voltage comparator, the second voltage comparator comparing the second comparison voltage with the input voltage and outputing a signal when the input voltage is below the second comparison voltage. Control logic selectively activates the selected ones of the first and second sets of switches in response to received control signals.

The inventive principles allow for the construction and operation of out-of-calibration circuits which can be used in a wide range of applications. By changing the number and size of the resistors within the resistor network, different nominal calibration voltages and tolerance ranges can be obtained. Moreover, the use of switches and control logic allow the calibration tolerances to be easily changed, even on the fly, as required by the given operating conditions of the embodying device.

BRIEF DESCRIPTION OF THE DRAWINGS

For a more complete understanding of the present invention, and the advantages thereof, reference is now made to the following descriptions taken in conjunction with the accompanying drawings, in which.

DESCRIPTION OF THE PREFERRED EMBODIMENT

The principles of the present invention and their advantages are best understood by referring to the illustrated embodiment depicted in FIGS. 1–4 of the drawings, in which like numbers designate like parts.

Figure 1:
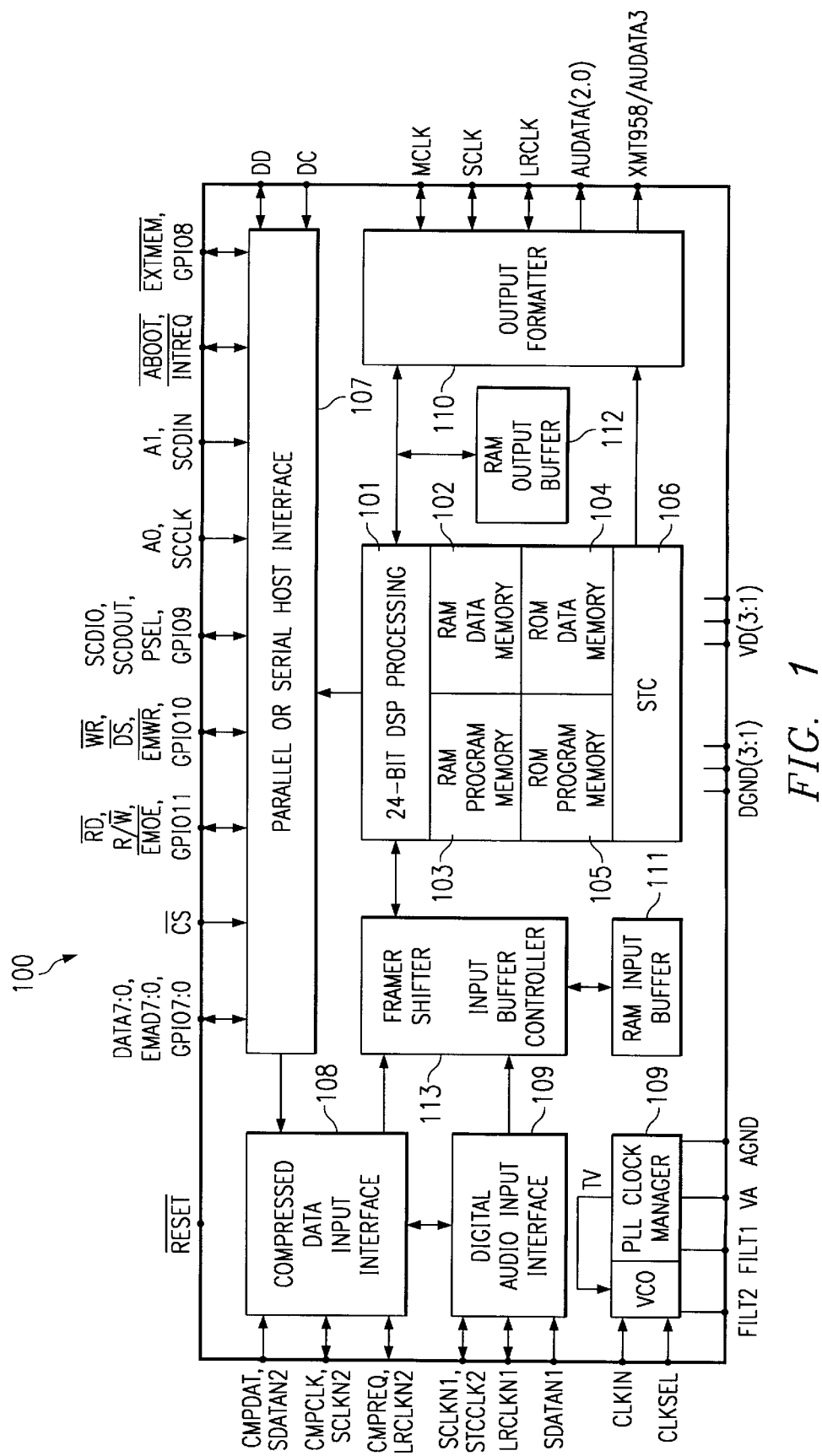
FIG. 1 is a high level functional block diagram of an audio decoder system on a chip suitable for practicing the principles of the present invention.

FIG. 1 is a high level functional block diagram of an audio decoder system on a chip 100 suitable for practicing the principles of the present invention. Decoder 100 is based on a 24 bit DSP 101 which supports the decoding and/or decompression of streamed audio data. For example, depending of the specific embodiment of decoder 100, the incoming data could be multi channel MPEG audio, Dolby Digital audio, DTS Digital Surround audio, or Meridian Lossless Packing formatted audio, to name only a few options. In the preferred embodiment, decoder 100 is one of the Cirrus Logic 49300 family of multistandard audio decoders.

DSP 101 operates in conjunction with on chip program and data memories, including program and data random access memories (RAM) 102 and 103 and program and data read only memories (ROM) 104 and 105. System synchronization is accomplished through a system time clock (STC) 106.

A parallel/serial interface 107 allows decoder 100 to interface with an external host processor in either parallel or serial modes through a set of multiplexed pins, including general purpose input/output pins GPIO[11:0]. Generally, in the parallel mode, pins DATA[7:0] are used as the parallel data interface with the external host, the /CS pin for chip select input, the /INTREQ pin for receiving interrupt requests, and the A0 and A1 pins for receiving register address bits. Depending on the specific parallel communications mode selected, a write enable can be input on pin /WR and an output enable signal on pin IRD, or a data strobe can be input on multiplexed pin /DS and a read-write select on pin R/W.

Interface 107 supports communications under either of the SPI or I²C serial protocols and parallel protocols. In the SPI mode, five communications lines are used including the chip select (/CS), serial clock (SCCLK), serial data in (SCDIN), serial data out (SCDOUT) and interrupt request (/INTREQ) lines. For the I²C protocol, three lines are used, namely the serial clock (SCCLK), bi-directional data (SCDIO) and interrupt request (/INTREQ) lines. Additionally, in the parallel modes, external memory is supported through multiplexed address and data pins (EMAD[7:0]), an output enable and address latch strobe (/EMOE) input, external memory write strobe (/EMWR) pin and external memory select (/EXTMEM) pin.

Compressed data input interface 108 is used for the input of audio data in either a compressed or PCM form. Specifically, PCM or compressed data are input through the serial data/compressed data (SDATAN2//CMPDATA) pin. Data exchanges are clocked by a serial bit clock output on pin (SCLKN2/CMPCLK). The LRCLKN2//CMPREQ pin outputs either a frame clock when uncompressed PCM data is being exchanged or a data request signal to the host in the case of compressed data.

A digital audio interface (DAI) 109 similarly supports the input of compressed (I2S) or PCM data. This port includes the SDATAN1/STCCLK pin for inputting serial data or a secondary STC clock, a serial clock output pin SCLKN1 and a frame clock output pin LRCLKN1.

DSP 101 outputs post processing digital data through output formatter 110. Output formatter 109 includes four pins AUDATA[0:3] for outputting multichannel digital audio. The AUDAT3 pin is additionally supported by an IEC60958 transmitter. Data are clocked using the serial clock SCLK and the frame clock LRCLK, which are derived from the master clock MCLK and output in the master mode and input in the slave mode. The master clock can be either input from an external source or generated internally using the PLL described below. The master clock frequency is a programmable multiple of the output sampling clock.

Data exchanges with DSP 101 are managed through a RAM input buffer 111 and a RAM output buffer 112. A frame shifter 113 allows data being exchanged with DSP 101 to align as required for various processing applications.

An on chip phase locked loop (PLL) and clock manager block is used to control the generation and selection of cocks required for both on chip operations and for the interfaces with external devices. The PLL operates in conjunction with an external RC filter provided at the FLT1 and FL2 pins. The reference clock driving the PLL is selected by the DSP from sources coupled to the SCLKN2, SCLKN2 or CLKIN pins. Alternatively, assertion of the CLKSEL signal allows the PLL to be bypassed and the clock appearing at the CLKIN pin to be switched directly to DSP 101.

PLL 109 operates from an internal oscillator controlled by a tuning voltage (tv). This tuning voltage can drift as a function of changes in environment, such as a change in temperature or supply voltage. In turn, a tuning voltage drift, if too large, can cause an unacceptable drifting of the PLL output frequencies. Hence, in precision processing systems, such as decoder 100, changes within the PLL tuning voltage beyond acceptable limits must be detected such that corrective adjustments can be made.

Figure 2:
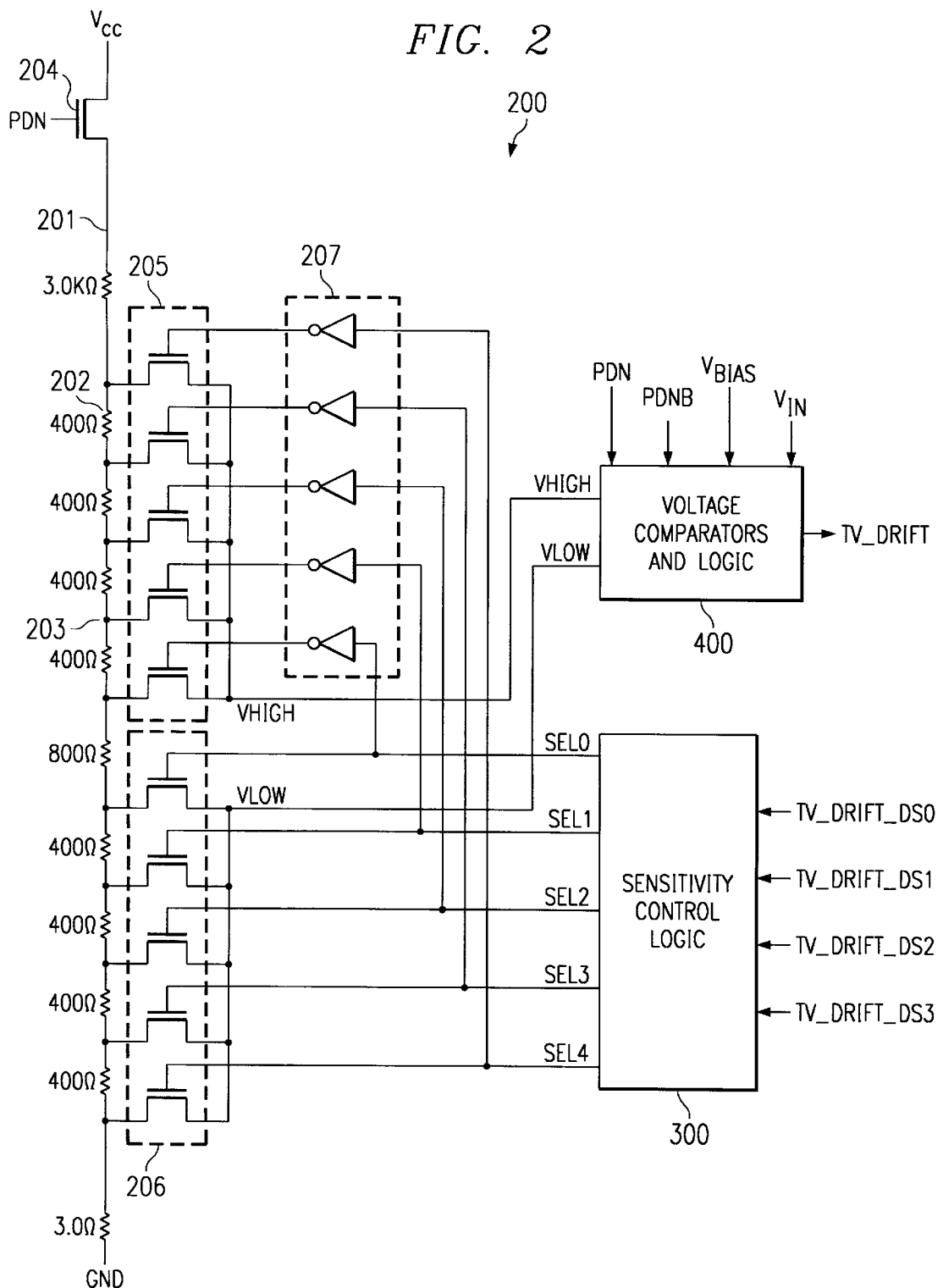
FIG. 2 is an electrical schematic depicting the major components of a multiple-bit out-of-calibration detection circuit according to the principles of the present invention.

FIG. 2 is an electrical schematic depicting the major components of a multiple bit out calibration detection circuit 200 according to the principles of the present invention. Generally, the controlling device can digitally select a range of acceptable voltages for the signal being monitored and provides a corresponding signal or flag when the monitored signal drifts outside that range. One of the many applications for out calibration circuit 200 is in the monitoring and control of the tuning voltage used in PLL circuitry, such as that of PLL block 109.

Detection circuit 200 is based on a linear resistor array 201 composed on n number of resistors 202 forming a voltage divider with m number of taps 203 disposed between the positive voltage rail Vcc and ground. A transistor 204 cuts off current flow for power savings during device power down in response to the power down control signal (pdn). The resistor values shown in FIG. 2 are exemplary and have been selected to provide the voltage sensitivity ranges discussed below with regards to TABLE 1. In various applications, these resistor values may change depending on such factors as the desired sensitivity range, the number of resistors and taps used, the supply voltage, among other things.

Each tap 203 is coupled to the current path of a corresponding switching transistor 205 or 206. Specifically, each transistor 205 selectively couples one of the upper five taps 203 of resistor network 201 to node VHIGH while each transistor 206 couples one of the lower five taps 203 of resistor network 201 to node VLOW. The gates of transistors 206 are respectively controlled by the selection control signals SEL0-SEL4. Those signals are inverted by inverters 207 and each of the inverted control signals /SEL0-/SEL4 are used to control the gate of a corresponding transistor 205.

Figure 3:
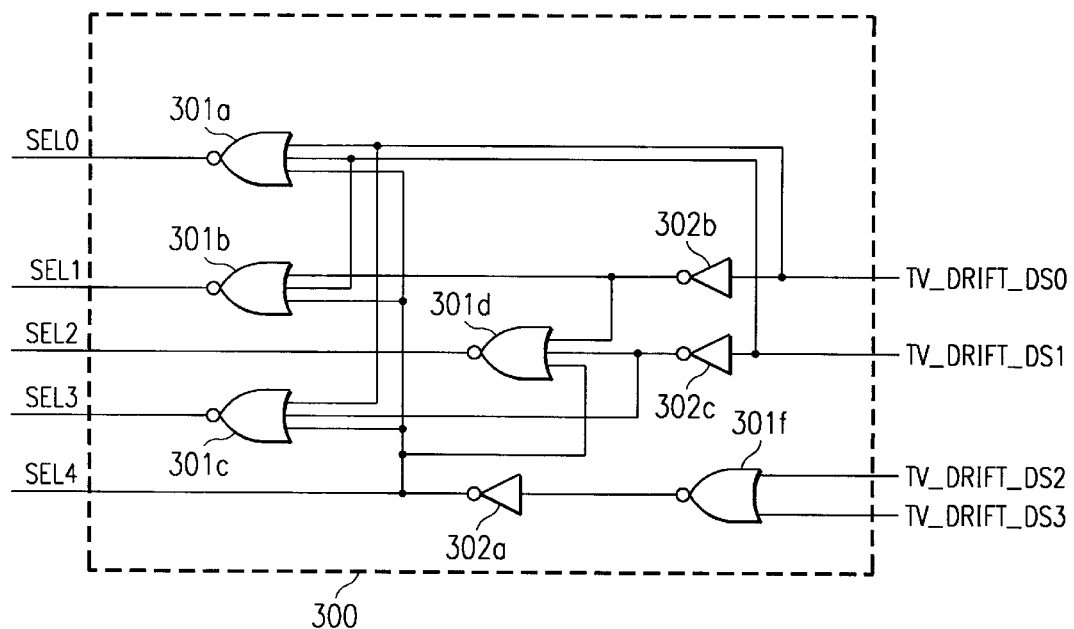
FIG. 3 illustrates a preferred embodiment, in which control logic is implemented using NOR gates and inverters, or equivalent logic.
Figure 4:
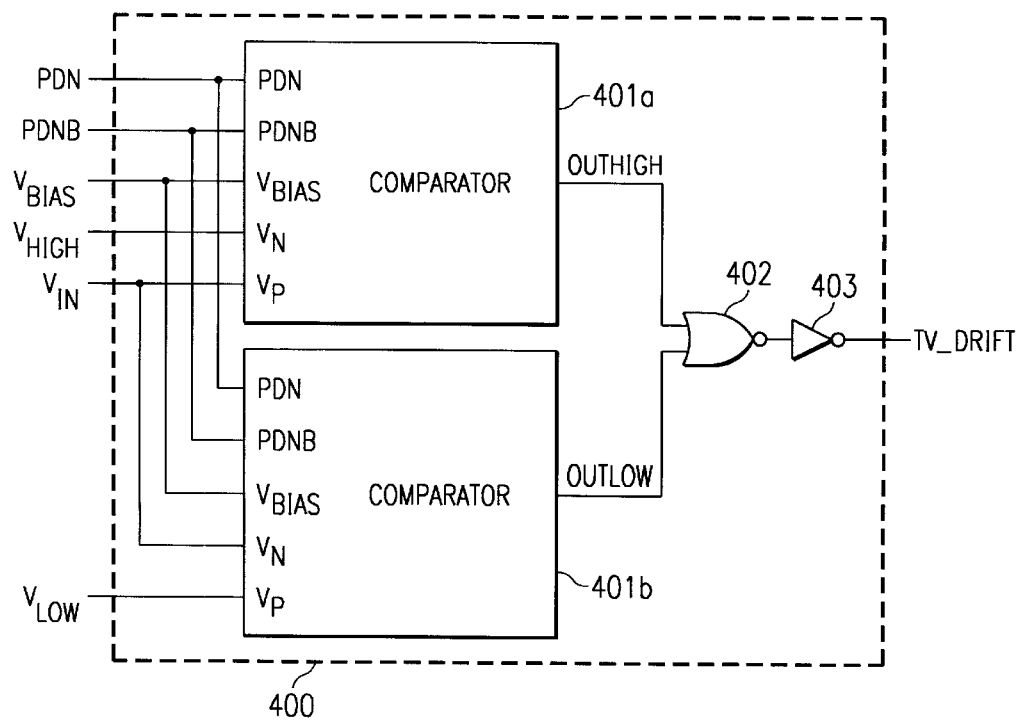
FIG. 4 illustrate in further detail the electrical schematic diagram of comparators and associated logic.

The selection control signals SEL0-SEL4 are generated by sensitivity control logic 300, in response to received control input signals tv_drift_ds0—tv_drift_ds3. In the preferred embodiment, control logic is implemented using NOR gates 301 and inverters 302, or equivalent logic, as shown in FIG. 3. In particular, selection control signals SEL0 SEL4, and their complements /SEL0/SEL4, activate one or more of the upper transistors 205 and one or more of the lower transistors to create a series of parallel current paths between Vcc and GND. The precise control and selection of the current paths through resistors 202 precisely controls the voltage at nodes VHIGH and VLOW.

The signal lines VHIGH and VLOW couple the voltage from the selected upper nodes and the selected lower nodes of voltage divider 201 to a corresponding pair of voltage comparators 400. Comparators 400, and associated logic, are shown in further detail in the electrical schematic diagram of FIG. 4. The inputs to comparators 400 are assumed to have a high impedance. The voltage on VHIGH is compared against the input voltage Vin, which could be for example the PLL tuning voltage discussed above, by comparator 401a. This comparison determines whether signal Vin has exceeded the upper allowable limit, in which case the output OUTHIGH of comparator 401a transitions to an active high state. To determine whether signal Vin has fallen below the lower allowable limit, the voltage on VLOW is compared against signal Vin using comparator 401b. If Vin is below the lower limit, a logic high voltage is presented at the OUTLOW output of comparator 401b.

The outputs OUTHIGH and OUTLOW are gated through a NOR gate 402 and inverter 403 to generate the signal or flag tv_drift. A logic high state of tv_drift indicates that the voltage Vin is outside of its limits and therefore compensation or adjustment in the circuitry generating Vin is required.

Table 1 describes the logic decoding for the preferred embodiment of the principles of the present invention shown in FIG. 2.

Table 1 describes the logic decoding for the preferred embodiment of the principles of the present invention shown in FIG. 2.

TABLE 1

| tv_drift_ds0 | tv_drift_ds1 | tb_drift_ds2 | tv_drift_ds3 | Sensitivity Level |
|---|---|---|---|---|
| 0 | 0 | 0 | 0 | ±100 mV |
| 0 | 0 | 0 | 1 | ±200 mV |
| 0 | 0 | 1 | 0 | ±300 mV |
| 0 | 0 | 1 | 1 | ±400 mV |
| 0 | 1 | 0 | 0 | ±500 mV |
| 0 | 1 | 0 | 1 | ±500 mV |
| 0 | 1 | 1 | 0 | ±500 mV |
| 0 | 1 | 1 | 1 | ±500 mV |
| 1 | 0 | 0 | 0 | ±500 mV |
| 1 | 0 | 0 | 1 | ±500 mV |
| 1 | 0 | 1 | 0 | ±500 mV |
| 1 | 0 | 1 | 1 | ±500 mV |
| 1 | 1 | 0 | 0 | ±500 mV |

TABLE 1-continued

| tv_drift_ds0 | tv_drift_ds1 | tb_drift_ds2 | tv_drift_ds3 | Sensitivity Level |
|---|---|---|---|---|
| 1 | 1 | 0 | 1 | ±500 mV |
| 1 | 1 | 1 | 0 | ±500 mV |
| 1 | 1 | 1 | 1 | ±500 mV |

In the illustrated case, the nominal voltage of Vin is taken to be Vcc/2. The maximum voltage swing of Vin is therefore (Vcc/2)±√maximum sensitivity to Vcc/2. In this example, the maximum allowable range which can be programmed is Vcc/2±100 mV and the smallest allowable range is (Vcc/2) ±500 mV. Again, the sensitivity and number of steps can be changed by changing the values of resistors 202.

The power down signal (pdn) and its complement (pdnb) allow comparators 401 to be selectively powered down, when not required, to save power. Additionally, comparators 401 are controlled by a common bias voltage Vbias.

Although the invention has been described with reference to a specific embodiments, these descriptions are not meant to be construed in a limiting sense. Various modifications of the disclosed embodiments, as well as alternative embodiments of the invention, will become apparent to persons skilled in the art upon reference to the description of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

It is therefore, contemplated that the claims will cover any such modifications or embodiments that fall within the true scope of the invention.

What is claimed:

1. A voltage out-of-calibration detector for detecting drift in signal voltage comprising:
   a voltage divider operating between first and second voltage rails and having a plurality of taps for generating first and second comparison voltages;
   a first set of switches for selectively coupling at least one of said plurality of taps to an input of a first voltage comparator, said first voltage comparator for comparing said first comparison voltage with an input voltage and outputting a signal when said input voltage exceeds said first comparison voltage;
   a second set of switches for selectively coupling at least one of said plurality of taps to an input of a second voltage comparator, said second voltage comparator for comparing said second comparison voltage with said input voltage and outputting a signal when said input voltage is below said second comparison voltage; and
   control logic for selectively activating selected ones of said first and second sets of switches by decoding a plurality of received control signals.

2. The detector of claim 1 wherein said voltage divider comprises a linear array of resistors and each said tap comprises a node between first and second selected transistors in said array.

3. The detector of claim 1 wherein said first and second switches comprise field effect transistors.

4. The detector of claim 2 wherein said first set of switches selectively couple ones of said plurality of taps to create a plurality of current paths through said resistor network to selectively generate said first comparison voltage.

5. The detector of claim 4 wherein said second set of switches selectively couple ones of said plurality of taps to create a plurality of current paths through said resistor network to selectively generate said second comparison voltage.

6. The detector of claim 1 and further comprising a switch for selectively coupling said voltage divider to a selected one of said voltage rails for selectively powering-down said voltage divider.

7. A voltage drift detector comprising:
   circuitry for deriving a plurality of voltages from a supply voltage;
   first circuitry including logic for decoding a plurality of received control signals for selecting a first one of said plurality of voltages to be a high comparison voltage;
   second circuitry including logic for decoding a plurality of received control signals for selecting a second one of said plurality of voltages to be a low comparison voltage;
   a first voltage comparator for comparing a voltage of an input signal with said high comparison voltage and outputting an active signal when the voltage of said input signal exceeds said high comparison voltage; and
   a second voltage comparator for comparing the voltage of said input signal with said low comparison voltage and outputting an active signal when the voltage of said input signal is below said low comparison voltage.

8. The voltage drift detector of claim 7 wherein said circuitry for deriving a plurality of voltages comprises a voltage divider.

9. The voltage drift detector of claim 8 wherein said voltage divider comprises a resistor network.

10. The voltage drift detector of claim 8 wherein said first circuitry for selecting comprises a plurality of switches for selectively coupling elements of said voltage divider to generate the high comparison voltage.

11. The voltage drift detector of claim 8 wherein said second circuitry for selecting comprises a plurality of switches for selectively coupling elements of said voltage divider to generate.

12. A method of detecting an out-of-calibration condition comprising the steps of:
   generating a plurality of voltages by selectively coupling taps of a voltage divider, the plurality of voltage including a high comparison voltage and a low comparison voltage, said step of generating including the substep of decoding a plurality of input control signals to selectively couple the taps of the voltage divider;
   comparing a voltage of an input signal with the high comparison voltage and outputting an active signal when the voltage of the input signal exceeds said high comparison voltage; and
   comparing the voltage of the input signal with the low comparison voltage and outputting an active signal when the voltage of the input signal is below the low comparison voltage.

13. The method of claim 12 wherein said step of generating a plurality of voltages comprises the step of selectively coupling nodes of a resistor network to create a plurality of current paths.

14. The method of claim 13 wherein said steps of comprising the substep of switching a selected one of at least one of the nodes of the resistor network to an input of a comparator.

15. A system on a chip comprising:
a voltage controlled circuit operating in response to a control voltage; and
a detector for monitoring said control voltage comprising:
- a voltage divider operating between first and second voltage rails and having a plurality of taps;
- a first set of switches for selectively coupling ones of said plurality of taps to provide a first comparison voltage to an input of a first voltage comparator, said first voltage comparator for comparing said first comparison voltage with an input voltage and outputing a signal when said input voltage exceeds said first comparison voltage;
- a second set of switches for selectively coupling ones of said plurality of taps to provide a second comparison voltage to an input of a second voltage comparator, said second voltage comparator for comparing said second set comparison voltage with said input voltage and outputing a signal when said input voltage is below said second comparison voltage; and
- control logic for selectively activating said first and second switches by decoding a plurality of received control signals.

16. The system on a chip of claim 15 wherein said voltage controlled circuitry comprises a phase locked loop.

17. The system on a chip of claim 15 wherein said system on a chip comprises an audio decoder.

* * * * *